(12) United States Patent
Ogawa et al.

(10) Patent No.: US 6,307,801 B1
(45) Date of Patent: Oct. 23, 2001

(54) TRIMMING CIRCUIT FOR SYSTEM INTEGRATED CIRCUIT

(75) Inventors: Yasushige Ogawa; Eisaku Itoh; Yoshiyuki Ishida, all of Kasugai (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 09/443,886

(22) Filed: Nov. 19, 1999

(30) Foreign Application Priority Data

Nov. 26, 1998 (JP) .................................................. 10-335616

(51) Int. Cl.$^7$ ...................................................... G11C 8/00
(52) U.S. Cl. ........................................ 365/226; 365/233.5
(58) Field of Search ................................. 365/226, 233.5

(56) References Cited

U.S. PATENT DOCUMENTS 5,917,751 * 6/1999 Wakita ............................ 365/185.11
5,923,612 * 7/1999 Park et al. .............................. 365/233

FOREIGN PATENT DOCUMENTS 8-204161    8/1996  (JP) .

* cited by examiner

*Primary Examiner*—David Nelms
*Assistant Examiner*—M. Tran
(74) *Attorney, Agent, or Firm*—Armstrong, Westerman, Hattori, McLeland & Naughton, LLP.

(57) ABSTRACT

A system LSI circuit which includes multiple memory circuits and functional logic circuits includes a control circuit for controlling the voltage supplied to the memory circuits. The control circuit includes trimming circuits for adjusting the memory supply voltages to ensure that the supplied voltages are within predetermined tolerances. The control circuit services all of the memory circuits, such that redundant logic functions are consolidated and multiple pads are not required to measure the memory supply voltages.

21 Claims, 8 Drawing Sheets

Fig.5(Prior Art)

Trimming Process  Not Conducted ○
                  Conducted ×

| f01 | ○ | × | ○ | × |
|-----|---|---|---|---|
| f02 | ○ | ○ | × | × |
| V1  | L | H | L | L |
| V2  | H | L | L | L |
| V3  | L | L | H | L |
| V4  | L | L | L | H |

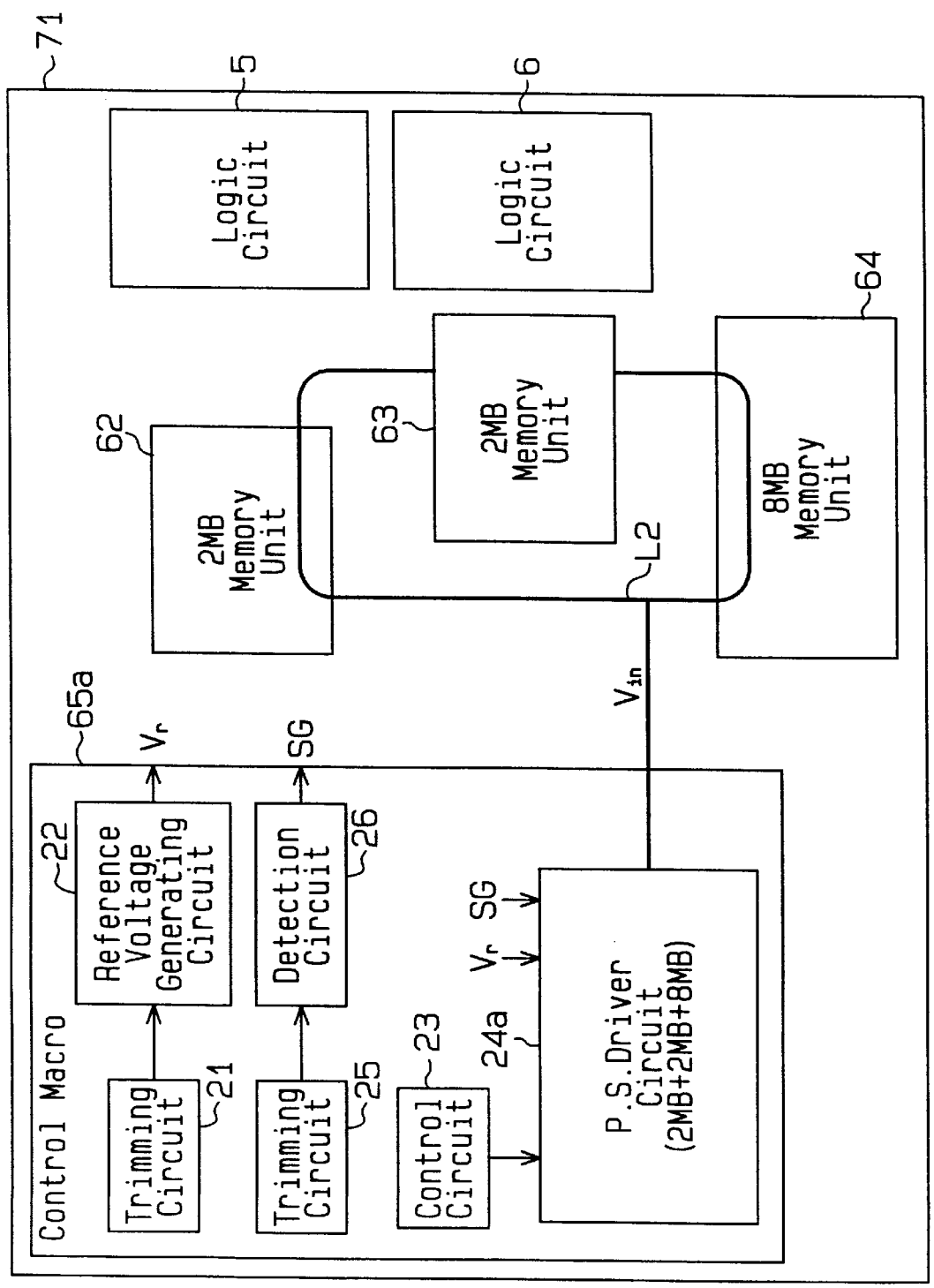

TRIMMING CIRCUIT FOR SYSTEM INTEGRATED CIRCUIT

BACKGROUND OF THE INVENTION

The present invention relates to semiconductor integrated circuits, and more particularly, to a system circuit incorporating memories and logic circuits.

The demand for combined memory/logic type system LSIs has increased in recent years. In such a system LSI, a plurality of memories are incorporated in a single device to meet the demands for decreasing power consumption and providing more functions. There is also a demand for decreasing the time required for testing the system LSI.

FIG. 1 shows an example of a prior art system LSI. The system LSI 1 includes two memory macros 2, 3, each having a memory capacity of 2MB, a memory macro 4 having a memory capacity of 8MB, and two logic circuits 5, 6. All of the circuits 2–6 are arranged at predetermined positions on a chip. Referring to FIG. 2, as known in the prior art, each of the memory macros 2–4 includes a memory cell array 10, a row decoder 11, a column decoder 12, an input/output circuit 13, an input buffer circuit 14, a mixer 15, and a power supply circuit 16. The memory macros 2, 3 differ from the memory macro 4 only in memory capacity and circuit scale, which is related to the memory capacity.

The power supply circuit 16 includes a pull-down circuit 20, which is shown in FIG. 3. The pull-down circuit 20 is provided with a trimming circuit 21, a reference voltage generating circuit 22, a control circuit 23, and a power supply driver circuit 24. The control circuit 23 receives an enable signal EN. The control circuit 23 shifts the power supply driver circuit 24 between an activated state and a deactivated state in accordance with the enable signal EN. The reference voltage generating circuit 22 sends a reference voltage $V_r$ to the power supply driver circuit 24. The power supply driver circuit 24 decreases the voltage of an external power supply based on the reference voltage $V_r$ and generates an internal power supply $V_{in}$. The internal power supply $V_{in}$ is sent to, for example, the memory cell array 10 as an operational power supply.

As shown in FIG. 4, the trimming circuit 21 includes two fuse circuits 31, 32 and four AND circuits 33–36. The fuse circuit 31 has a first NMOS transistor $T_{r1}$, a fuse f01, and two inverters 31a, 31b. The source of the first NMOS transistor $T_{r1}$ is connected to a low potential power supply $V_{SS}$. The drain of the first NMOS transistor $T_{r1}$ is connected to the high potential power supply $V_{CC}$ via the fuse f01 and to its gate via the inverter 31a. The drain of the first NMOS transistor $T_{r1}$ outputs a detection signal n01z. The detection signal n01z is inverted by the inverter 31b and output as a detection signal n01x.

The fuse circuit 32 has a second NMOS transistor $T_{r2}$, a fuse f02, and two inverters 32a, 32b. The structure of the fuse circuit 32 is identical to that of the fuse circuit 31. The drain of the second NMOS transistor $T_{r2}$ outputs a detection signal n02z. The detection signal n02x is also output from the drain of the second NMOS transistor $Tr_2$ via the inverter 32b.

The detection signals n01x, n02z are received by the first AND circuit 33. An output voltage V1 is output from the output terminal of the first AND circuit 33 in accordance with the signals n01x, n02z. The detection signals n01x, n02z are received by the second AND circuit 34. An output voltage V2 is output from the output terminal of the second AND circuit 34 in accordance with the signals n01z, n02z. The detection signals n01z, n02x are received by the third AND circuit 35. An output voltage V3 is output from the output terminal of the third AND circuit 35 in accordance with the signals n01z, n02x. The detection signals n01x, n02x are received by the fourth AND circuit 36. An output voltage V4 is output from the output terminal of the fourth AND circuit 36 in accordance with the signals n01x, n02x. The first to third AND circuits 33–35 are each connected to the reference voltage generating circuit 22.

As shown in FIG. 4, the reference voltage generating circuit 22 includes a resistor R and seven NMOS transistors $T_{r3}$–$T_{r9}$. The resistor R and the four NMOS transistors $T_{r3}$–$T_{r6}$ are connected in series between the high potential power supply $V_{CC}$ and the low potential power supply $V_{SS}$. The gate and drain of each NMOS transistor $T_{r3}$–$T_{r6}$ are connected to each other. That is, each of the NMOS transistors $T_{r3}$–$T_{r6}$ acts as a diode.

The source of the third NMOS transistor $T_{r3}$ is connected to the low potential power supply $V_{SS}$ via the seventh NMOS transistor $T_{r7}$. The drain of the third NMOS transistor $T_{r3}$ is an output node. The reference voltage $V_r$ is sent from the output node to a measuring pad P, which is arranged on the power supply driver circuit 24. The gate of the seventh NMOS transistor $T_{r7}$ receives the output voltage V1. The source of the fourth NMOS transistor $T_{r4}$ is connected to the low potential power supply $V_{SS}$ via the eighth NMOS transistor $T_{r8}$. The gate of the eighth NMOS transistor $T_{r8}$ receives the output voltage V2. The source of the fifth NMOS transistor $T_{r5}$ is connected to the low potential power supply $V_{SS}$ via the ninth NMOS transistor $T_{r9}$. The gate of the ninth NMOS transistor $T_{r9}$ receives the output voltage V3.

As shown in FIG. 5, in the trimming circuit 21 and the reference voltage generating circuit 22, only the output voltage V2 goes high when both fuses f01, f02 do not undergo trimming (as indicated by the circles). In this case, the eighth NMOS transistor $T_{r8}$ is activated. Accordingly, the reference voltage $V_r$ has a level obtained by distributing the potential difference between the high potential power supply $V_{CC}$ and the low potential power supply $V_{SS}$ to the resistor R and the ON resistance of the two NMOS transistors $T_{r3}$, $T_{r4}$.

If trimming is performed on only the fuse f01 (as marked by the "X"), only the output voltage V1 goes high. In this case, the seventh NMOS transistor $T_{r7}$ is activated. Accordingly, the reference voltage $V_r$ has a level obtained by distributing the potential difference between the high potential power supply $V_{CC}$ and the low potential power supply $V_{SS}$ to the resistor R and the ON resistance of the third NMOS transistor $T_{r3}$.

If trimming is performed on only the fuse f02, only the output voltage V3 goes high. In this case, the ninth NMOS transistor $T_{r9}$ is activated. Accordingly, the reference voltage $V_r$ has a level obtained by distributing the potential difference between the high potential power supply $V_{CC}$ and the low potential power supply $V_{SS}$ to the resistor R and the ON resistance of the three NMOS transistors $T_{r3}$–$T_{r5}$.

If trimming is performed on both of the fuses f01, f02, only the output voltage V4 goes high, while output voltages V1–V3 all go low. Accordingly, the NMOS transistors $T_{r7}$–$T_{r9}$ remain deactivated. As a result, the reference voltage $V_r$ has a level obtained by distributing the potential difference between the high potential power supply $V_{CC}$ and the low potential power supply $V_{SS}$ to the resistor R and the ON resistance of the four NMOS transistors $T_{r3}$–$T_{r6}$.

When testing the system LSI 1 before shipment out of the factory, the reference voltage $V_r$ output from the measuring output pad P is measured by a measuring apparatus to determine whether or not the reference voltage $V_r$ is within a predetermined range. If the measured reference voltage $V_r$ is not in the predetermined range, trimming is carried using the fuses f01, f02 in accordance with the amount offset from the predetermined range. The reference voltage generating circuit 22 generates the reference voltage $V_r$ in accordance with the level based on the combination of the fuses f01, f02 that undergo or do not undergo trimming, or in accordance with the predetermined voltage value. Such trimming is conducted on each of the memory macros 2–4.

The system LSI 1 is designed by a layout apparatus (CAD apparatus). As shown in FIG. 1, library data such as logic circuits or memory macros including the memory macros 2–4 are stored in a library Lb. Various types of information such as layout data and net information are also included in the library data.

Each memory macro is formed so that it operates as a single unit. Accordingly, the CAD apparatus selects the memory macro having the desired memory capacity from the library Lb and arranges the selected memory macro on a chip to design the system LSI with the memory function of the selected memory macro.

As a result, the number of trimming circuits 21 in the system LSI 1 is equal to the number of memory macros arranged in the system LSI 1 (three trimming circuits 21 for the above three memory macros 2–4). When the system LSI 1 is tested prior to shipment out of the factory, the reference voltage $V_r$ is measured and trimming is conducted on each of the memory macros. Thus, a long time is required for the testing. The long testing time increases the cost of the system LSI.

Furthermore, a measuring pad P must be provided for the pull-down circuit 20 of each memory macro 2–4 in the chip on which the system LSI 1 is formed. The plurality of measuring pads P interferes with high integration of the system LSI 1.

This problem is not limited to only the pull-down voltage circuit 20. For example, the power supply circuit 16 includes a substrate potential generating circuit (not shown) which generates a substrate potential. The substrate potential generating circuit includes a power supply driver circuit, a detection circuit, and a trimming circuit similar to that of FIG. 4. The detection circuit detects the substrate potential and sends the detection signal to the power supply driver circuit. The power driver circuit generates the substrate potential based on the detection signal. A measuring pad is arranged on the chip to measure the substrate potential. During testing, the substrate potential at the measuring pad is measured. If the measured value is not included in the predetermined range, trimming is conducted on the fuse in the trimming circuit so that the measured value enters the predetermined range. Accordingly, the same problems as described above occurs, making the chip more costly.

SUMMARY OF THE INVENTION

Accordingly, it is an object of the present invention to provide a method for designing a semiconductor integrated circuit that has a decreased testing time and enhanced integration.

To achieve the above object, the present invention provides a semiconductor integrated circuit including a plurality of memory units and a reference potential control circuit connected to the plurality of memory units to control a reference potential at each of the memory units.

In another aspect of the present invention, a method for designing a semiconductor integrated circuit is provided. The method includes the steps of preparing data of a control macro used to control a reference potential at each of a plurality of memory units, preparing data of each of the memory units, laying out each of the memory units and the control macro on a chip using the data of each of the memory units and the data of the control macro, and connecting each of the memory units and the control macro.

In a further aspect of the present invention, a computer readable recording medium which includes program code for generating layout data of a semiconductor integrated circuit is provided. The program code performs the steps of preparing data of a control macro used to control a reference potential at each of a plurality of memory units, preparing data of each of the memory units, laying out each of the memory units and the control macro on a chip using the data of each of the memory units and the data of the control macro, and connecting each of the memory units and the control macro.

Other aspects and advantages of the present invention will become apparent from the following description, taken in conjunction with the accompanying drawings, illustrating by way of example the principles of the invention.

BRIEF DESCRIPTION OF THE DRAWINGS

The features of the present invention that are believed to be novel are set forth with particularity in the appended claims. The invention, together with objects and advantages thereof, may best be understood by reference to the following description of the presently preferred embodiments together with the accompanying drawings in which:

FIG. 5 is a table showing patterns taken during trimming by the trimming circuit of FIG. 4;

FIG. 9 is a block diagram showing a system LSI according to a third embodiment of the present invention.

DETAILED DESCRIPTION OF THE PREFERRED EMBODIMENTS

Figure 1:
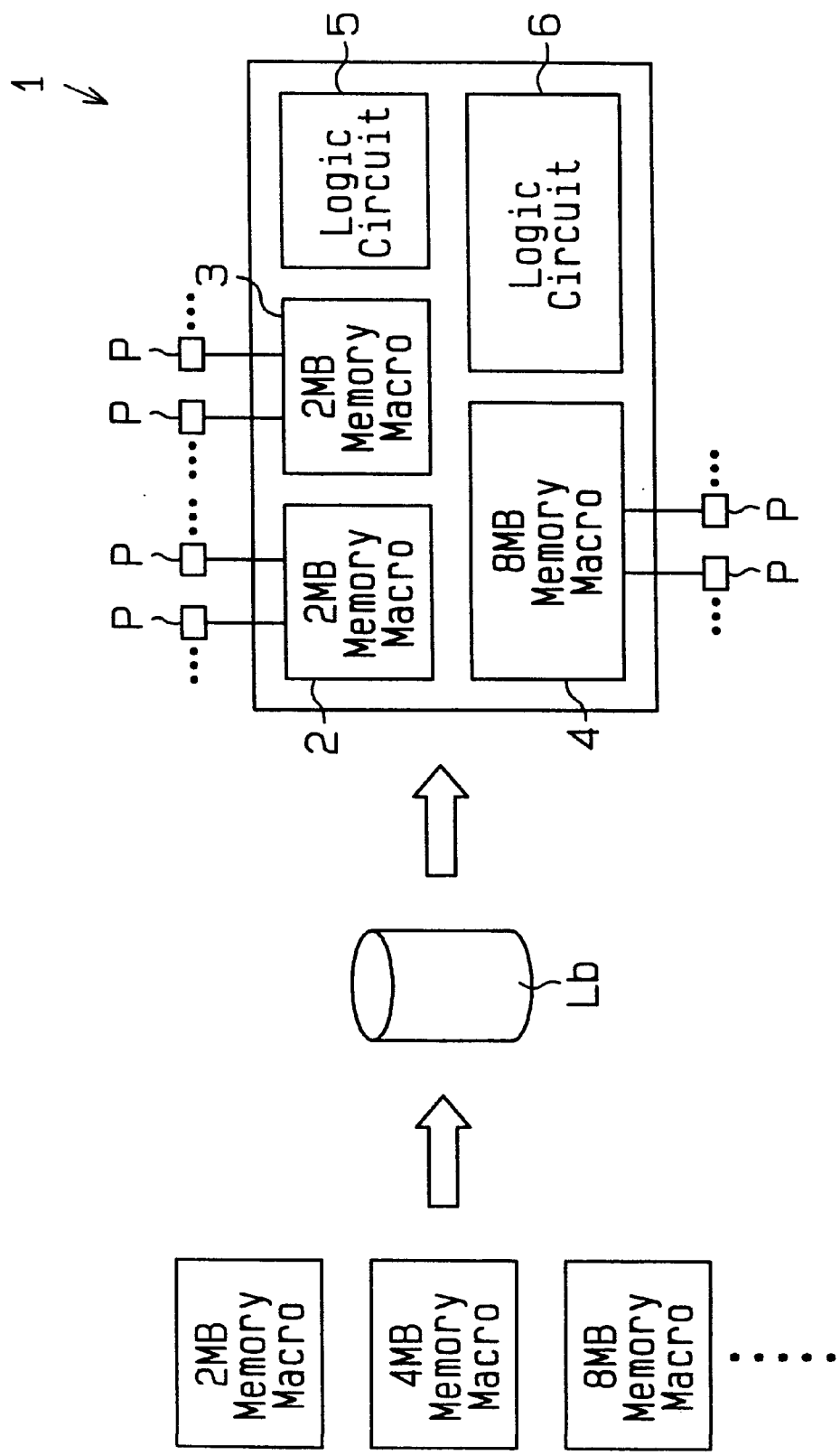
FIG. 1 a block diagram showing a prior art system LSI.
Figure 2:
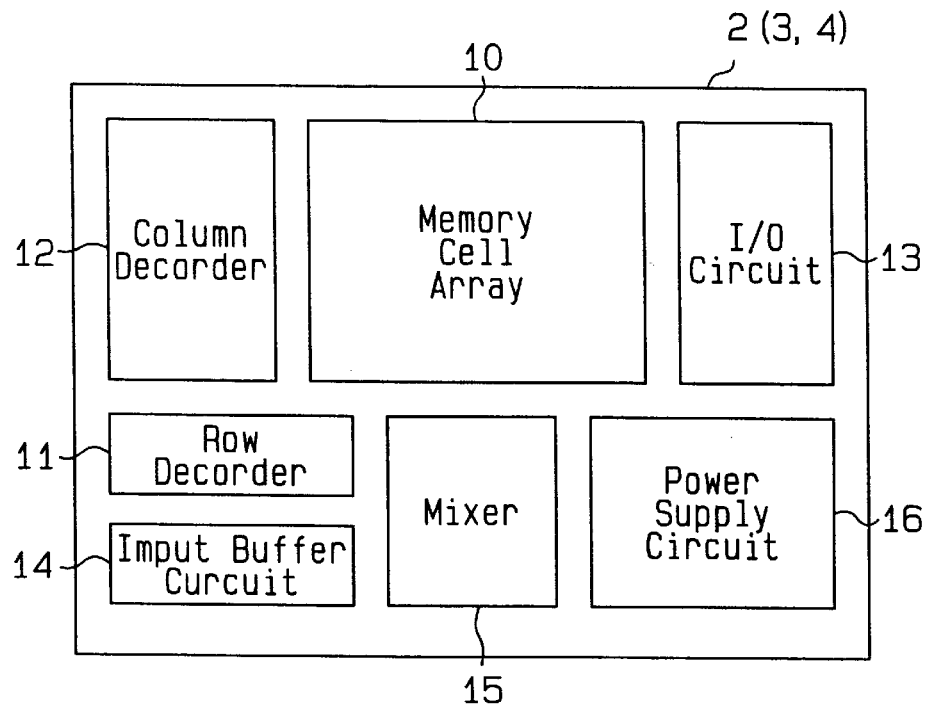
FIG. 2 is a block diagram showing a memory macro of the system LSI of FIG. 1.
Figure 3:
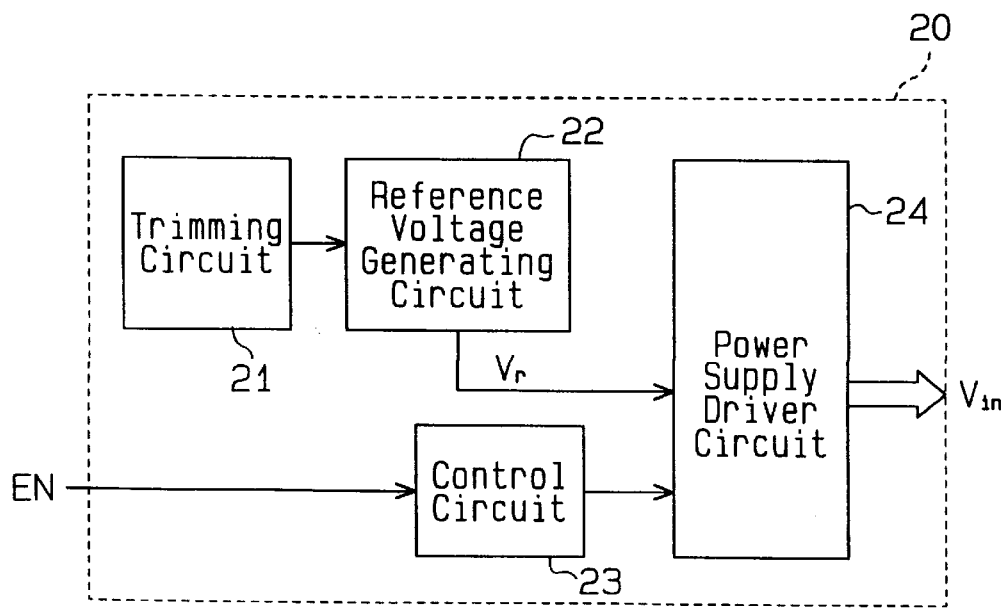
FIG. 3 is a schematic block diagram showing a pull-down circuit.

An LSI 51 according to a first embodiment of the present invention will now be described with reference to FIGS. 6 and 7. To avoid redundancy, like or same reference numerals are given to those components that are the same as the corresponding components of FIGS. 1 to 4.

Figure 6:
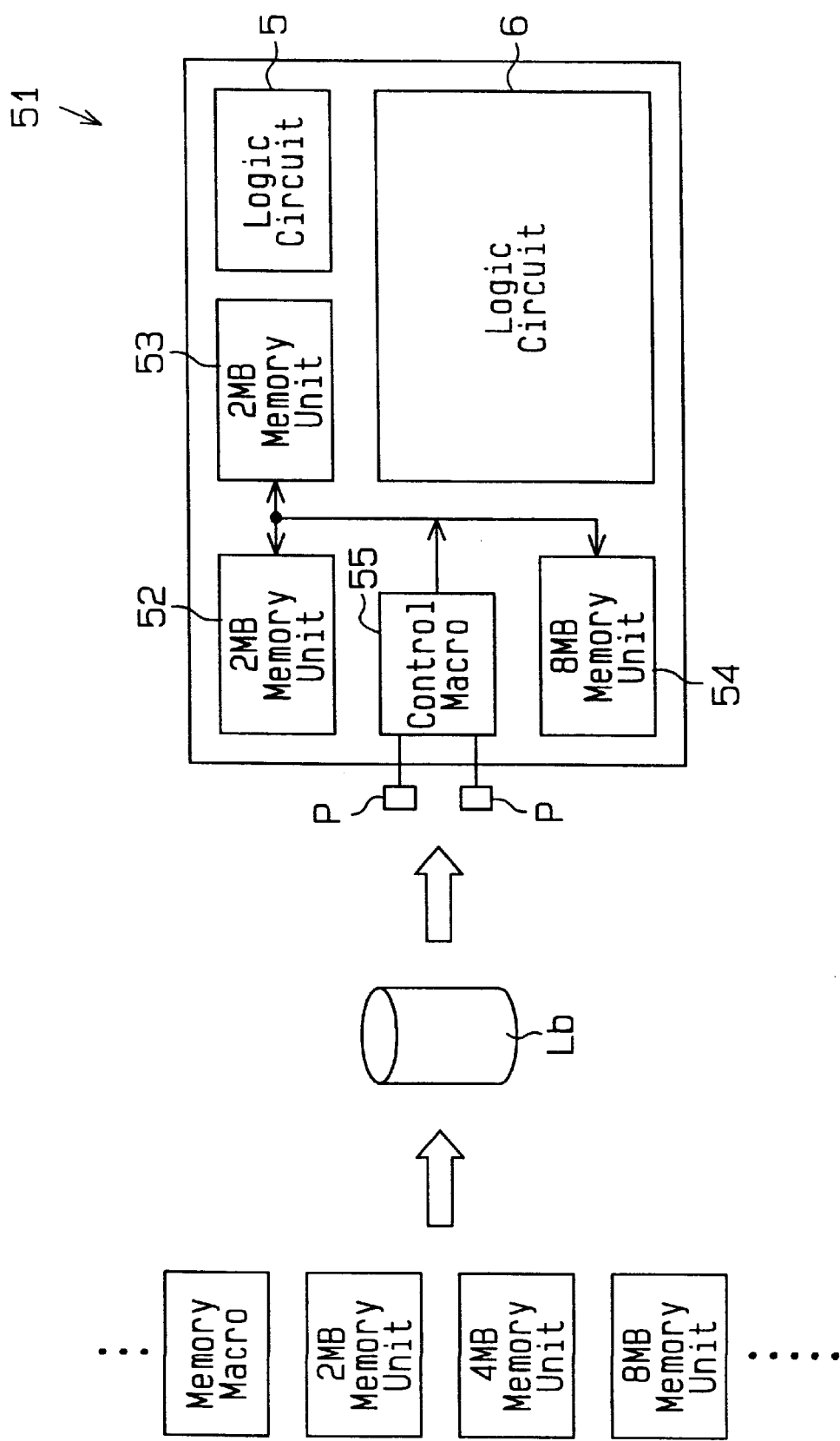
FIG. 6 is a block diagram showing a system LSI according to a first embodiment of the present invention.
Figure 7:
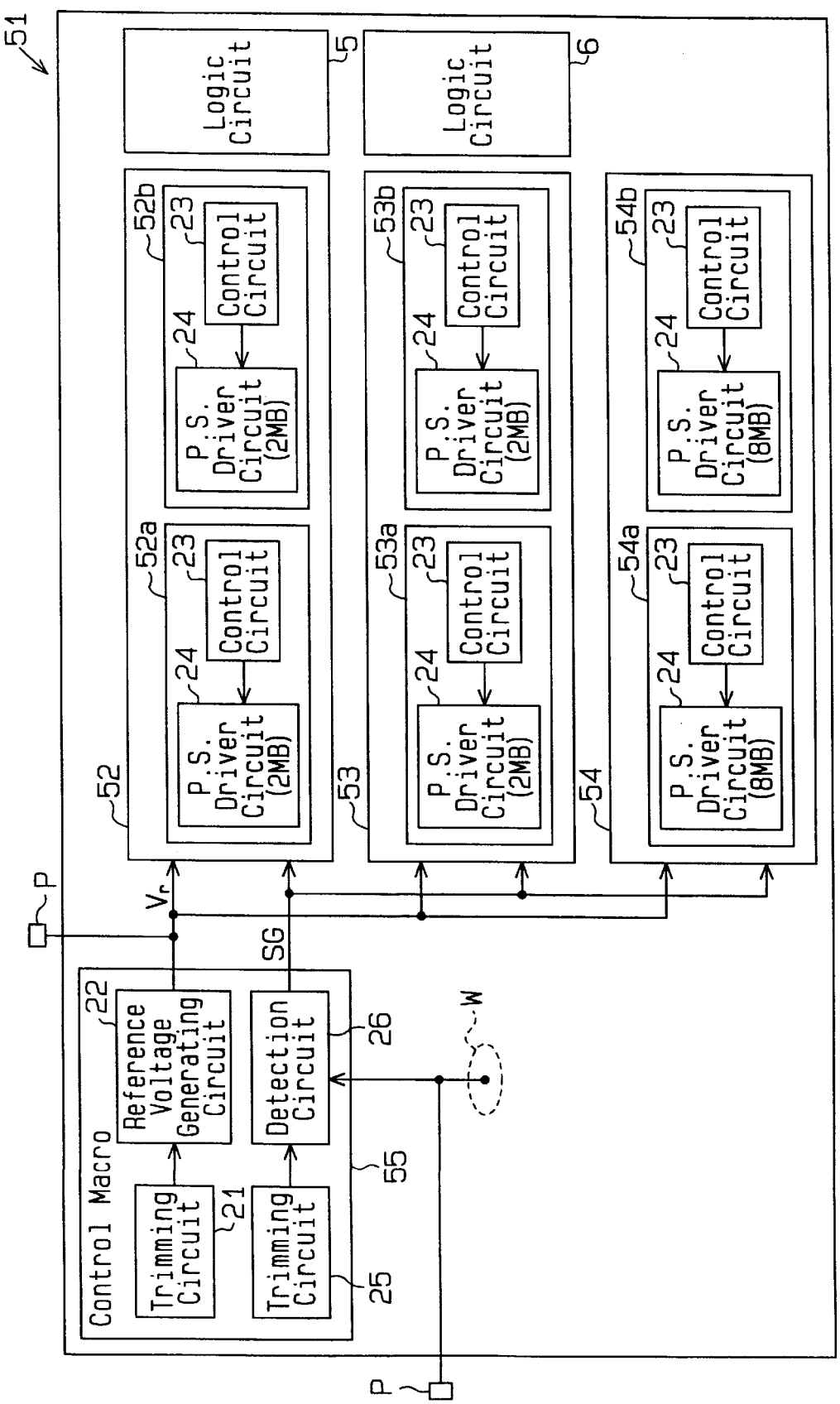
FIG. 7 is a more detailed block diagram showing the system LSI of the first embodiment.

As shown in FIG. 6, the system LSI 51 includes two memory units 52, 53, each having a memory capacity of 2MB, a memory unit 54 having a memory capacity of 8MB, a control macro 55 functioning as a reference potential control circuit, and two logic circuits 5, 6. Each of the circuits 52–55, 5, 6 are located at predetermined positions on a chip.

The memory units 52–54, which are similar to the memory macros 2–4 of FIG. 1, each include the memory cell array 10, the row decoder 11, the column decoder 12, the input/output decoder circuit 13, the input buffer circuit 14, and the mixer 15 (none of which are shown). As shown in FIG. 7, the memory units 52–54 each further include pull-down circuits 52a–54a and substrate potential generating circuits 52b–54b. The pull-down circuits 52a–54a and the substrate potential generating circuits 52b–54b each have a control circuit 23 and a power supply driver circuit 24. The structure of the circuits 52a–54a, 52b–54b are substantially the same.

The control macro 55 has two trimming circuits 21, 25, a reference voltage generating circuit 22, and a detection circuit 26. The reference voltage generating circuit 22 and the detection circuit 26 perform an adjusting function. The trimming circuit 21 and the reference voltage generating circuit 22 are provided in association with the pull-down circuits 52a–54a, while the trimming circuit 25 and the detection circuit 26 are provided in association with the substrate potential generating circuits 52b–54b. The reference voltage generating circuit 22 is connected to the power supply driver circuit 24 of each of the pull-down circuits 52a–54a and generates a reference voltage $V_r$. The detection circuit 26 is connected to the power supply driver circuit 24 of each of the substrate potential generating circuits 52b–54b. The detection circuit 26 sends a detection signal SG to each of the power supply driver circuits 24 of the substrate potential generating circuits 52b–54b. The detection signal SG is based on a predetermined potential, which is generated in accordance with the combination of the fuses f01, f02 (FIG. 4) that undergo trimming (FIG. 5), and a substrate potential.

In the system LSI 51, the pull-down circuits 52a–54a of the respective memory units 52–54 use the same trimming circuit 21 and the reference voltage generating circuit 22, and the substrate potential generating circuits 52b–54b of the respective memory units 52–54 use the same trimming circuit 25 and the same detection circuit 26. The trimming circuits 21, 25, the reference voltage generating circuit 22, and the detection circuit 26 do not depend on the memory capacity of the memory units 52–54. Thus, these circuits 21, 25, 22, 26 are arranged apart from the memory units 52–54 in the control macro 55. Since the memory capacity of the memory units 52–54 depends on the power driver circuit 24, each of the memory units 52–54 is provided with a power supply driver circuit 24 having a circuit scale that corresponds with the memory capacity.

Figure 4:
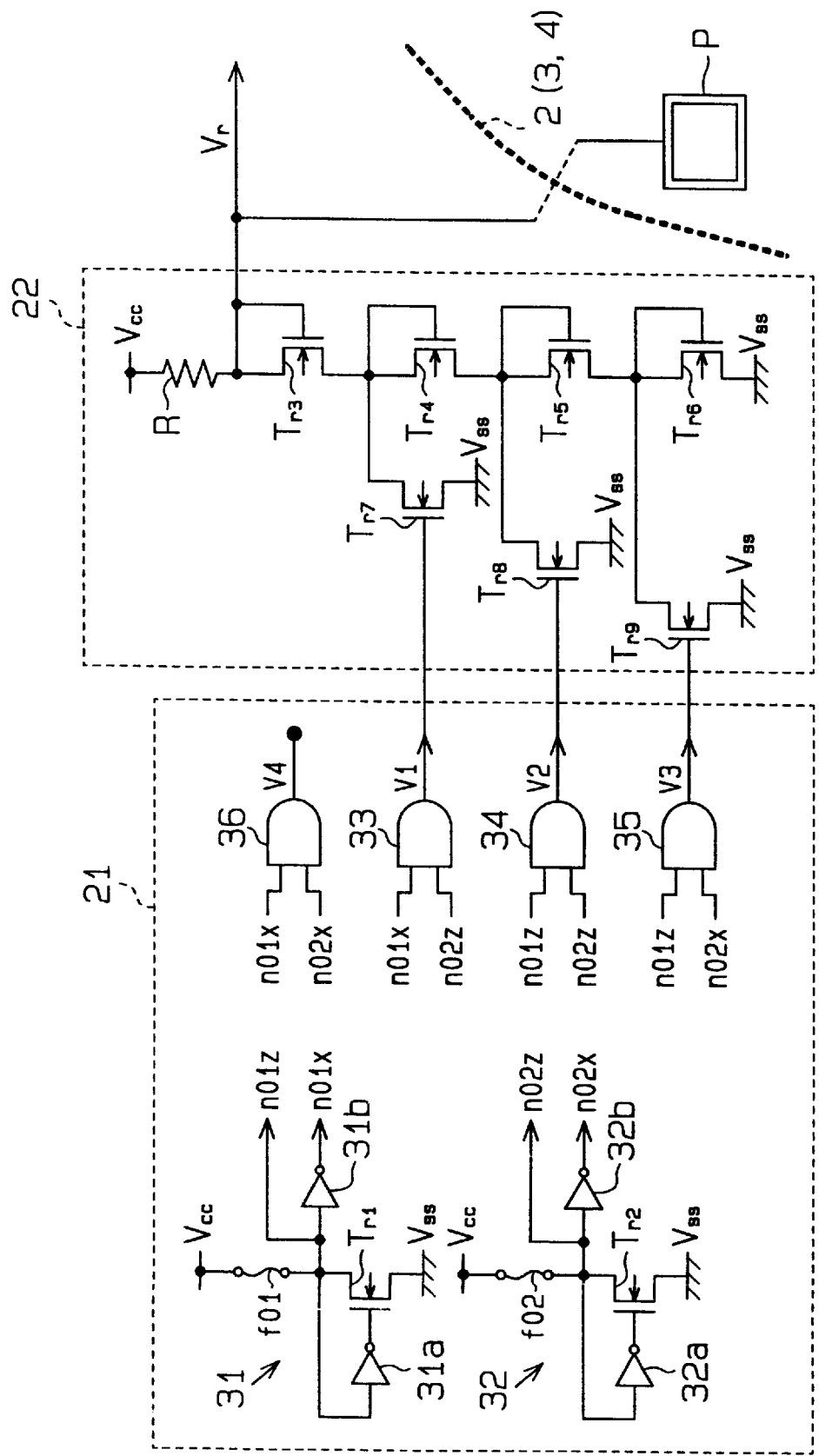
FIG. 4 is a schematic circuit diagram showing a trimming circuit and a reference voltage generating circuit of the pull-down circuit of FIG. 3.

The reference voltage generating circuit 22 is connected to a measuring pad P, which is located on the chip 10 of the LSI 51, to measure the reference voltage $V_r$. When testing the system LSI 51 before shipment out of the factory, the reference voltage $V_r$ output at the measuring pad P is measured by a measuring apparatus (not shown) to determine whether or not the reference voltage $V_r$ is included in a predetermined range. If the measured reference voltage $V_r$ is not within the predetermined range, trimming is carried out on the fuses f01, f02 in accordance with the amount offset from the predetermined range (FIG. 4). The reference voltage generating circuit 22 generates the reference voltage $V_r$ in accordance with the level based on the combination of the fuses f01, f02 that undergo or do not undergo trimming, or in accordance with the predetermined voltage value, and supplies the power supply driver circuit 24 of each pull-down circuit 52a–54a with the reference voltage $V_r$. Therefore, the power supply driver circuits 24 generate an internal power supply $V_{in}$ by pulling down an external power supply in accordance with the reference voltage $V_r$.

In the same manner, the detection circuit 26 is connected to a second measuring pad P, which is located on the chip of the LSI 51, to measure the substrate potential output at the memory cell array 10. When testing the system LSI 51, the substrate potential at the measuring pad P is measured by a measuring apparatus (not shown) to determine whether or not the substrate potential is included in a predetermined range. If the measured substrate potential is not included in the predetermined range, trimming is carried out on the fuses f01, f02 in accordance with the amount offset from the predetermined range. The detection circuit 26 sends a detection signal SG, which is based on the combination of the fuses f01, f02 that undergo or do not undergo trimming, to the power supply driver circuit 24 of each of the substrate potential generating circuits 52b–54b. Therefore, the power supply driver circuits 24 generate a substrate potential having the predetermined voltage value and supplies a well W of each memory cell array 10 with the substrate potential.

Trimming is conducted by the trimming circuits 21, 25 which are arranged on the control macro 55. The trimming circuit 21 undergoes trimming to supply all three memory units 52–54 with the reference voltage $V_r$ of a predetermined range. The trimming circuit 25 undergoes trimming so that the substrate potential at all three memory units 52–54 are included in a predetermined range. Consequently, the system LSI 51 is manufactured with its operational characteristics included in a predetermined range.

The layout data of the system LSI 51 is generated by a layout design apparatus (not shown), such as a CAD apparatus. The library Lb shown in FIG. 6 is stored in a memory device of the CAD apparatus. The library Lb has a section for storing the library data of memory units having various memory capacities including the 2MB and 8MB memory units and a section for storing the library data of various control macros including the control macro 55. The library Lb is recorded on a recording medium (including a memory device) which can be read by a CAD apparatus formed by a computer system.

The CAD apparatus reads the library data of memory units 52–54 and the control macro 55 corresponding to the 2MB, 8MB memory units 52–54 in accordance with the specification data of the system LSI 51. The CAD apparatus arranges the memory units 52–54, the control macro 55, and other devices at predetermined positions on the chip and generates wiring data based on the specification data (net list). In this manner, the library data stored in the library Lb is used to generate the layout data of the system LSI 51.

The CAD apparatus that generates the layout data is a computer system. To generate the layout data with the computer system, the above processes are, for example, recorded on a recording medium having a program code that can be read by the computer system. A ROM or a backup RAM can be used as the recording medium. The ROM or the backup RAM is incorporated in a computer system. Further, a floppy disk, a magneto-optical disk, a CD-ROM, or a hard disk having a program code that can be read by a computer can also be used as the recording medium. In this case, each of the processes are performed by loading the computer system with the program code as required.

The first embodiment has the advantages described below.

(1) In the system LSI 51, the pull-down circuits 52a–54a of the memory units 52–54 use the same trimming circuit 21, which is not dependant on the memory capacities of the memory units 52, 54, and the reference voltage generating circuit 22. In the same manner, the substrate potential generating circuits 52b–54b use the same trimming circuit 25 and the detection circuit 26. Each of the circuits 21, 22, 25, 26 are arranged in the control macro apart from the memory units 52–54. Accordingly, when testing the system LSI 51, the measurement and trimming of the reference voltage $V_r$ output by the reference voltage generating circuit 22 and the measurement and trimming of the level of the detection signal SG output by the detection circuit 26 need be performed only on the single control macro 55. In other words, since each memory unit need not be tested, the time required for testing the system LSI 51 is shortened.

(2) The trimming circuits 21, 25, the reference voltage generating circuit 22, and the detection circuit 26 are used as common devices. This decreases the number of circuits required to be formed on the chip. Furthermore, the number of the pads P for measuring the reference voltage $V_r$ and the level of the detection signal SG is decreased. Hence, the integration of the LSI 51 is enhanced.

Figure 8:
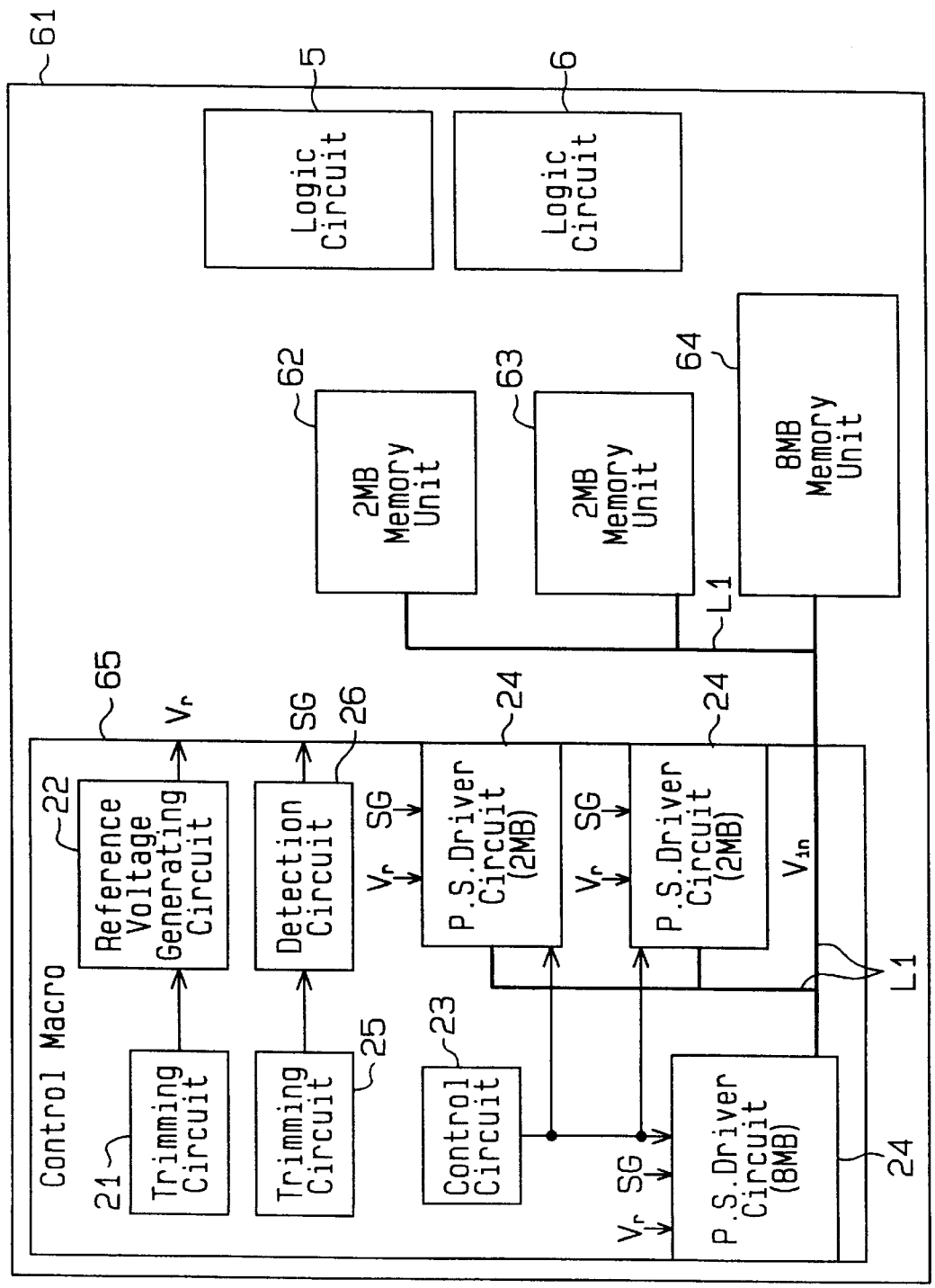
FIG. 8 is a block diagram showing a system LSI according to a second embodiment of the present invention.

A system LSI 61 according to a second embodiment of the present invention will now be described with reference to FIG. 8. The description will center on those parts that differ from the first embodiment.

In the first embodiment, the power supply driver circuits 24 and the control circuit 23 are incorporated in each of the memory units 52–54. In the system LSI 61 of the second embodiment, the power supply driver circuit 24 and the control circuits 23 are not incorporated in the memory units 62–64 as shown in FIG. 8. Instead, in the system LSI 61, a control macro 65 incorporates three power supply driver circuits 24 capable of supporting a memory capacity of 2MB, 2MB, and 8MB, respectively, and a control circuit 23. The control circuit 23 is used by the three power supply driver circuits 24. In this case, a power supply line L1 having a size corresponding to the internal power supply $V_{in}$ generated by the power supply driver circuits 24 connects the control macro 65 (the power supply driver circuits 24) to the memory units 62–64.

An LSI 71 according to a third embodiment of the present invention will now be described with reference to FIG. 9. The description will center on those parts that differ from the second embodiment.

As shown in FIG. 9, a control macro 65a has one power supply driver circuit 24a instead of the three power supply driver circuits 24 of the second embodiment. The power supply driver circuit 24a has a high supplying capacity and supplies the internal power supply $V_{in}$, to all three memory units 62–64. Like the second embodiment, in the third embodiment, a power supply line L2 having a size corresponding to the internal power supply generated by the power supply driver circuit 24a connects the control macro 65a (the power supply driver circuit 24a) to the memory units 62–64. A loop connecting the memory units 62–64 may be formed by the power supply line L2.

The first to third embodiments of the present invention may be modified as described below.

In the third embodiment, the power supply driver circuit 24a need not provide the power supply to all of the memory units. That is, the control macro 65a may incorporate a plurality of power supply driver circuits in correspondence with the number of memory unit combinations. For example, a power supply driver circuit can be provided for the two memory units 62, 63 and a further memory unit 64 can be provided for the memory unit 64.

In the first embodiment, the trimming circuits 21, 25, the reference voltage generating circuit 22, and the detection circuit 26 are incorporated in the control macro 55. However, these circuits 21, 22, 25, 26 need not be arranged in the control macro 55 as long as they can be used as common circuits.

In the first to third embodiments, the present invention is applied to the pull-down circuits 52a–54a which generate the internal power supply $V_{in}$ by pulling down the external power supply in accordance with the reference voltage $V_r$. However, the present invention may also be applied to pull-up circuits which generate the internal power supply by pulling up the external power supply in accordance with the reference voltage $V_r$.

It should be apparent to those skilled in the art that the present invention may be embodied in many other specific forms without departing from the spirit or scope of the invention. Therefore, the present examples and embodiments are to be considered as illustrative and not restrictive, and the invention is not to be limited to the details given herein, but may be modified within the scope and equivalence of the appended claims.

What is claimed is:

1. A semiconductor integrated circuit comprising:
a plurality of memory units; and
a reference potential control circuit connected to the plurality of memory units to control a reference potential at each of the memory units, wherein the reference potential control circuit includes a trimming circuit for performing a trimming process and generating a predetermined potential in order to generate the reference potential within a predetermined range.

2. The semiconductor integrated circuit according to claim 1, wherein the reference potential control circuit further includes an adjusting circuit connected to the trimming circuit for generating the reference potential using the predetermined potential generated by the trimming circuit.

3. The semiconductor integrated circuit according to claim 2, wherein the adjusting circuit includes a reference potential generating circuit for generating the reference potential, and wherein the trimming circuit includes a fuse trimming circuit having a plurality of fuses connected to the reference generating circuit, the fuse trimming circuit generating the predetermined potential in accordance with a combination of the fuses as determined by the trimming process.

4. The semiconductor integrated circuit according to claim 2, wherein the trimming circuit includes a fuse trimming circuit having a plurality of fuses, the fuse trimming circuit generates the predetermined potential in accordance with a combination of the fuses as determined by the trimming process, and wherein adjusting circuit includes a detection circuit connected to the fuse trimming circuit to generate a detection potential and the predetermined potential.

5. The semiconductor integrated circuit according to claim 1, wherein the plurality of memory units each include a power supply driver circuit having a capacity corresponding to the memory capacity of the associated memory unit.

6. The semiconductor integrated circuit according to claim 1, wherein the reference potential control circuit includes a plurality of power supply driver circuits, each one connected to a corresponding one of the memory units, each of the power supply driver circuits having a capacity corresponding to the memory capacity of the associated one of the memory units.

7. The semiconductor integrated circuit according to claim 1, wherein the reference potential control circuit includes a power supply driver circuit connected to the plurality of memory units and having a capacity corresponding to the total memory capacity of the plurality of memory units.

8. A method for designing a semiconductor integrated circuit comprising the steps of:

preparing data for a control macro used to control a reference potential at each of a plurality of memory units;

preparing data of each of the memory units;

laying out each of the memory units and the control macro on a chip using the data of each of the memory units and the data of the control macro; and connecting each of the memory units and the control macro, wherein the data of the control macro includes the data of a trimming circuit for performing a trimming process and generating a predetermined potential in order to generate the reference potential within a predetermined range.

9. The method for designing the semiconductor integrated circuit according to claim 8, wherein the data of the control macro includes the data of an adjusting circuit connected to the trimming circuit, the adjusting circuit for generating the reference potential using the predetermined potential generated by the trimming circuit.

10. The method for designing the semiconductor integrated circuit according to claim 9, wherein the data of each of the memory units includes the data of a power supply driver circuit having a capacity corresponding to the memory capacity of the associated memory unit.

11. The method for designing the semiconductor integrated circuit according to claim 9, wherein the data of the control macro includes the data of a plurality of power supply driver circuits having a capacity corresponding to the memory capacity of the memory units.

12. The method for designing the semiconductor integrated circuit according to claim 9, wherein the data of the control macro includes the data of a power supply driver circuit having a capacity corresponding to the total memory capacity of the plurality of memory units.

13. The method for designing the semiconductor integrated circuit according to claim 9, wherein the data of the control macro includes the data of a reference potential generating circuit for generating the reference potential, and the data of a fuse trimming circuit for generating the predetermined potential in accordance with the combination of a plurality of fuses as determined by the trimming process.

14. The method of designing the semiconductor integrated circuit according to claim 9, wherein the data of the adjusting circuit includes the data of a fuse trimming circuit having a plurality of fuses, the fuse trimming circuit having a plurality of fuses, the fuse trimming circuit generating the predetermined potential in accordance with the combination of the fuses determined by the trimming process and the data of the detection circuit for generating a detection potential and the predetermined potential.

15. A computer readable recording medium which includes program code for generating layout data of a semiconductor integrated circuit, the program code performing the steps of:

preparing data of a control macro used to control a reference potential at each of a plurality of memory units;

preparing data of each of the memory units;

laying out each of the memory units and the control macro on a chip using the data of each of the memory units and the data of the control macro;

connecting each of the memory units and the control macro, wherein the data of the control macro includes the data of a trimming circuit for performing a trimming process and generating a predetermined potential in order to generate the reference potential within a predetermined range.

16. The recording medium according to claim 15, wherein the data of the control macro includes the data of an adjusting circuit connected to the trimming circuit for generating the reference potential using the predetermined potential generated by the trimming circuit.

17. The recording medium according to claim 16, wherein the data of an adjusting circuit includes the data of a reference potential generating circuit for generating the reference potential, and the data of the trimming circuit includes data of a fuse trimming circuit having a plurality of fuses, the fuse trimming circuit generating the predetermined potential in accordance with a combination of the fuses as determined by the trimming process.

18. The recording medium according to claim 16, wherein the data of the adjusting circuit includes the data of a fuse trimming circuit having a plurality of fuses, the fuse trimming circuit generating the predetermined potential in accordance with the combination of the fuses determined by the trimming process and the data of a detection by the trimming process and the data of a detection circuit for generating a detection potential and the predetermined potential.

19. The recording medium according to claim 15, wherein the data of each of the memory units includes the data of a power supply driver circuit having a capacity corresponding to the memory capacity of the associated memory unit.

20. The recording medium according to claim 15, wherein the data of the control macro includes the data of a plurality of power supply driver circuits connected to an associated one of the memory units, each having a capacity corresponding to the memory capacity of the associated one of the memory units.

21. The recording medium according to claim 15, wherein the data of the control macro includes the data of a power supply driver circuit having a capacity corresponding to the total memory capacity of the plurality of memory units.

* * * * *